United States Patent [19]

Bartilson

[11] Patent Number: 5,083,194
[45] Date of Patent: Jan. 21, 1992

[54] AIR JET IMPINGEMENT ON MINIATURE PIN-FIN HEAT SINKS FOR COOLING ELECTRONIC COMPONENTS

[75] Inventor: Bradley W. Bartilson, Chippewa Falls, Wis.

[73] Assignee: Cray Research, Inc., Minneapolis, Minn.

[21] Appl. No.: 465,042

[22] Filed: Jan. 16, 1990

[51] Int. Cl.$^5$ .............. H01L 23/02; H01L 25/04; H01L 39/02
[52] U.S. Cl. ............................. 357/81; 357/74; 357/80; 357/82; 361/383; 361/384; 165/80.3; 165/104.33
[58] Field of Search ............. 357/81, 82, 74, 75, 357/80; 361/383, 384, 385; 165/80.3, 104.33

[56] References Cited

U.S. PATENT DOCUMENTS

| | | | |
|---|---|---|---|
| 2,948,518 | 8/1960 | Kraus | 257/313 |
| 3,065,384 | 11/1962 | Sprude | 317/101 |
| 3,070,729 | 12/1962 | Heidler | 317/100 |
| 3,141,999 | 7/1964 | Schneider | 317/100 |
| 3,198,991 | 8/1965 | Barnett | 317/100 |
| 3,417,814 | 12/1968 | Oktay | 165/105 |
| 3,527,989 | 9/1970 | Cuzner et al. | 317/100 |
| 3,737,728 | 6/1973 | Austin | 317/100 |
| 3,741,292 | 6/1973 | Aahallu et al. | 165/105 |
| 3,851,221 | 11/1974 | Beaulieu et al. | 317/100 |
| 3,999,105 | 12/1976 | Srcheyn et al. | 317/100 |
| 4,072,188 | 2/1978 | Wilson et al. | 165/80 |
| 4,104,700 | 8/1978 | Huthison et al. | 361/384 |
| 4,204,247 | 5/1980 | Wrigley | 361/387 |
| 4,283,754 | 8/1981 | Parks | 361/382 |
| 4,420,739 | 12/1983 | Herren | 338/53 |
| 4,450,472 | 5/1984 | Tuckerman et al. | 357/82 |
| 4,535,385 | 8/1985 | August et al. | 361/388 |
| 4,536,824 | 8/1985 | Barrett et al. | 361/384 |
| 4,578,926 | 7/1988 | Herrell et al. | 361/385 |
| 4,628,407 | 12/1988 | August et al. | 361/388 |
| 4,839,774 | 6/1989 | Hamburger | 361/383 |
| 4,884,168 | 11/1989 | August et al. | 361/382 |
| 5,014,904 | 5/1991 | Morton | 228/176 |

FOREIGN PATENT DOCUMENTS 0129966  1/1985 European Pat. Off. .
1274165 11/1986 U.S.S.R. .............. 361/384
2204181 11/1989 United Kingdom .

OTHER PUBLICATIONS

*Computer Design*, vol. 23, No. 14, Dec. 1984, AT&T Technologies, Inc., (Littleton, Mass., U.S.A.), "IBM Packs in High Desity Circuits", pp. 254–255.
IBM Technical Disclosure Bulletin, vol. 20, No. 9, pp. 3727–3728, Feb. 1978.
IBM Technical Disclosure Bulletin, vol. 21, No. 9, pp. 3591–Feb. 1979.
IBM Technical Disclosure Bulletin, vol. 8, No. 10, pp. 146, 1461, Mar. 1966.
Local Heat Transfer to Staggered Array of Inpinging Circular Array Jets–1983 Translation of ASME, vol. 105, pp. 354–359.
Heat Transfer with Impinging Jets Argon National Labs 1983, pp. 7–15.
Heat Sinks for Gate. Arrays.
Flow Visualization in an Impinging Circular Air Jet, 1989 National Heat Conference, HTD vol. 112.
Cooling of a Multichip Electronic Module by Means of Confined Two-Dimensional Jets of Dielectric Liquid, 1989 National Heat Transfer Conference, HTD, vol. 111.
Impingement Cooling of Electronics 1989 National Transfer Conference, HTD, vol. 111.
(List continued on next page.)

Primary Examiner—Rolf Hille
Assistant Examiner—D. Ostrowski
Attorney, Agent, or Firm—Merchant, Gould, Smith, Edell, Welter & Schmidt

[57] ABSTRACT

An air-jet impingement cooling method combined with a miniature pin-fin heat sink provides equivalent fluid flow to each IC package in a module and achieves a high heat transfer rate per volume. The packaging design is comparable to high-density packaging systems utilizing low-temperature coolant.

18 Claims, 3 Drawing Sheets

OTHER PUBLICATIONS

Air Jet Impingement Cooling of an Array of Simulated Electronic Packaging, 1989 National Heat Transfeer, HTD, vol. 111.

Local Heat Transfer Coefficients Under an Axisymmetric, Single-Phase Liquid Jet, 1989 Heat Transfer Conference, HTD, vol. 111.

Jet Impingement Flow Boiling of a Mixture of FC-72 and FC-87 Liquid on a Simulated Electronic Chip, 1989 National Heat Transfer, HTD, vol. 111.

Thermal Performance Characteristics of Air-Cooled Cold Plates for Electronic Cooling, 1989 National Heat Transfer, HTD, vol. 111.

Building Parallelism into the Instruction Pipeline, High Performance Systems, Dec. 1989, pp. 53-60.

"Heat Transfer From Pin-Fins Situated in an Oncoming Longitudinal Flow Which Turns to Crossflow", by E. M. Sparrow and E. D. larson, *Int. J. Heat Mass Transfer*, vol. 25, No. 5, pp. 603-614, 1982.

"Effect of Inlet, Exit, and Fin Geometry on Pin Fins Situated in a Turning Flow", by E. M. Sparrow et al., *Int. J. Heat Mass Transfer*, vol. 27, No. 27, pp. 1039-1053, 1984.

"Performance Comparisons Among Geometrically Different Pin-Fin Arrays Situated in an Oncoming Longitudinal Flow", by E. D. Larson and E. M. Sparrow, *Int. J. Heat Mass Transfer*, vol. 25, No. 5, pp. 723-725, 1982.

"Experimental Investigation of Multi-jet Impingement Cooling of an Array of Microelectronic Heat Sources", by L. M. Jigi and Z. Dagan, Aug. 1986.

"Thermal Impact of Double-Sided Printed Circuit Cards", by T. L. Davis.

"High-Performance Heat Sinking for VLSI", by D. B. Tuckerman and R. F. W. Pease, IEEE Electron Device Letters, vol. EDL-2, No. 5, May 1981, pp. 126-129.

"Heat Transfer in Forced Convection Through Fins", by Robert W. Keyes, IEEE Transactions on Electron Devices, vol. ED-31, No. 9, Sep. 1984, pp. 1218-1221.

"Heat-Transfer Microstructures for Integrated Circuits", by D. B. Tuckerman, Feb. 1984, Stanford Electronics Laboratories, Stanford University.

"Impingement Cooling of Electronics: Effects of Venting Through Circuit Board", by B. R. Hollworth, K. A. Maxwell, and L. S. Ukeiley, pp. 80-96, IEPS Conference (Sep. 11-18, 1989).

"Forced-Convection, Liquid-Cooled, Microchannel Heat Sinks for High-Power-Density Microelectronics", by R. J. Phillips, L. R. Glicksman, and R. Larson, pp. 295-316.

"Heat Sinks Cool Hot Computers", *Tooling & Production*, Jul. 1991.

AIR JET IMPINGEMENT ON MINIATURE PIN-FIN HEAT SINKS FOR COOLING ELECTRONIC COMPONENTS

BACKGROUND OF THE INVENTION

1. Field of the Invention

The present invention relates generally to a cooling system for use with electronic devices, and more particularly, to an air jet impingement cooling method used with a miniature pin-fin heat sink.

2. Description of Related Art

Mechanisms to remove the heat from microelectronic packages are receiving greater attention due to the inherent power density increases associated with higher levels of integration. This is especially true with the microelectronic packages used in supercomputers, for example, those manufactured by Cray Research, Inc., the Assignee of the present invention.

The techniques which the packaging engineer may use to reject these high levels of heat generation often conflict with electrical design parameters and goals. More specifically, the greater speed of these packages may require closer spacing, or the project may set goals to package the system within a given volume, thus reducing the available volume within which the thermal "conduit" may exist.

The techniques employed for cooling microelectronic packages must also be reviewed at each packaging level. For example, a low temperature coolant technique may produce efficient packaging at the chip and board level, and yet require extensive hardware and volume at the higher packaging levels.

Air-cooled electronic systems traditionally exhibit large board-to-board spacing to allow room for heat sinks and also to create a low-resistance fluid path. A number of difficulties are present in this situation:

1) The path of least resistance for the fluid is around the heat sinks. Thus, much of the fluid passes by the IC packages unheated.
2) The fluid often follows a cross flow path across an array of IC packages on a printed circuit board, so that the packages furthest downstream are exposed to a higher temperature fluid due to heat gain from upstream packages.
3) In general, the heat sink size must be proportional to the heat generation of the IC package.

SUMMARY OF THE INVENTION

To overcome the limitations in the prior art described above, and to overcome other limitations that will become apparent upon reading and understanding this specification, the present invention combines an air-jet impingement cooling method with a miniature pin-fin heat sink to provide equivalent fluid flow to each IC package in a module and to achieve a high heat transfer rate per volume.

DESCRIPTION OF THE DRAWINGS

In the drawings, where like numerals refer to like elements throughout the several views.

DETAILED DESCRIPTION OF THE PREFERRED EMBODIMENT

In the following detailed description, reference is made to the accompanying drawings which form a part hereof and in which is shown by way of illustration a preferred embodiment in which the invention may be practiced. It is to be understood that other embodiments may be utilized and that structural changes may be made without departing from the scope of the present invention.

The preferred embodiment of the present invention combines an air-jet impingement cooling method with a miniature pin-fin heat sink. Such an arrangement provides equal fluid flow to each microelectronic package and maximizes the heat transfer rate.

Figure 1:
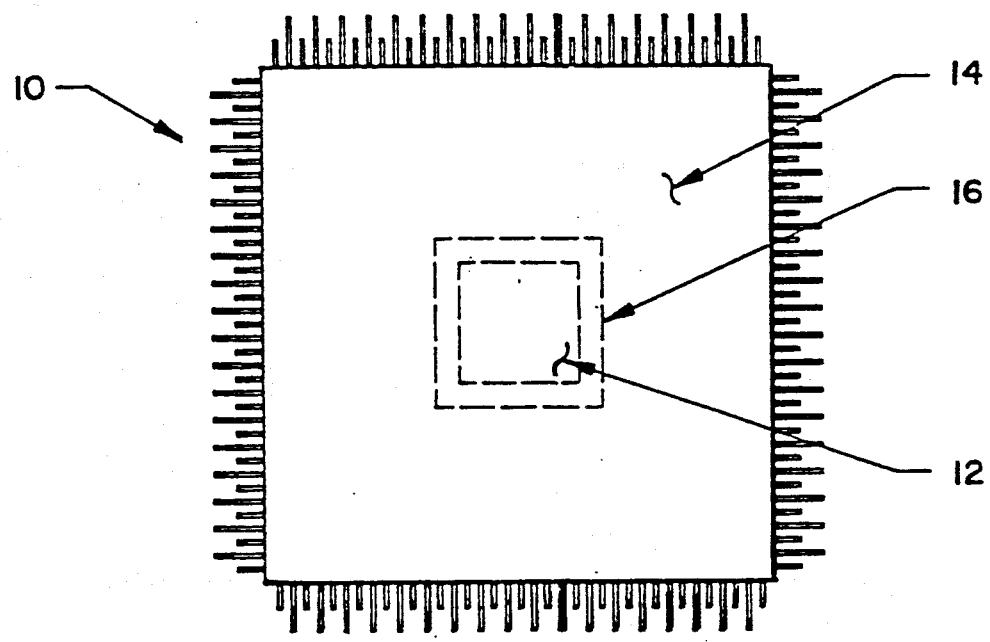
FIG. 1 is a top view of an integrated circuit.

High levels of integration for a microelectronic package inevitably results in increases in the power density of the package. FIG. 1 is a top view of a dense microelectronic package, i.e., a typical 2500 gate array integrated circuit 10 comprised of a silicon die 12 and a ceramic package 14. The silicon die 12 measures approximately 0.265"×0.265""0.020" and is mounted in the center of the ceramic package 14, which measures approximately 1.14"×1.14"×0.105". This integrated circuit 10 may generate more than 12 watts of heat during its operation and thus requires an efficient method for dissipating heat.

An analysis of the temperature distribution throughout the ceramic package 14 shows that the primary heat path is in a small area beneath the silicon die 12. A miniature pin-fin heat sink 16 is used in the preferred embodiment to facilitate thermal transfer from the primary heat path.

The miniature pin-fin heat sink 16 facilitates thermal transfer in two ways. First, it provides greater surface area for transferring heat to the fluid. Second, it separates an impinging air jet into separate fluid paths, thereby breaking up a recovery zone that develops under the center of the air jet.

Without the miniature pin-fin heat sink 16, the impinging air jet would be directed at a planar surface, i.e., the ceramic package 14, creating a thermal boundary layer from a backwash of the air jet. The force of the air jet can push this thermal boundary layer down near the surface of the ceramic package 14, but it remains a "recovery zone" that limits the thermal efficiency of the air jet. The miniature pin-fin heat sink 16 helps reduce the recovery zone.

Figure 2:
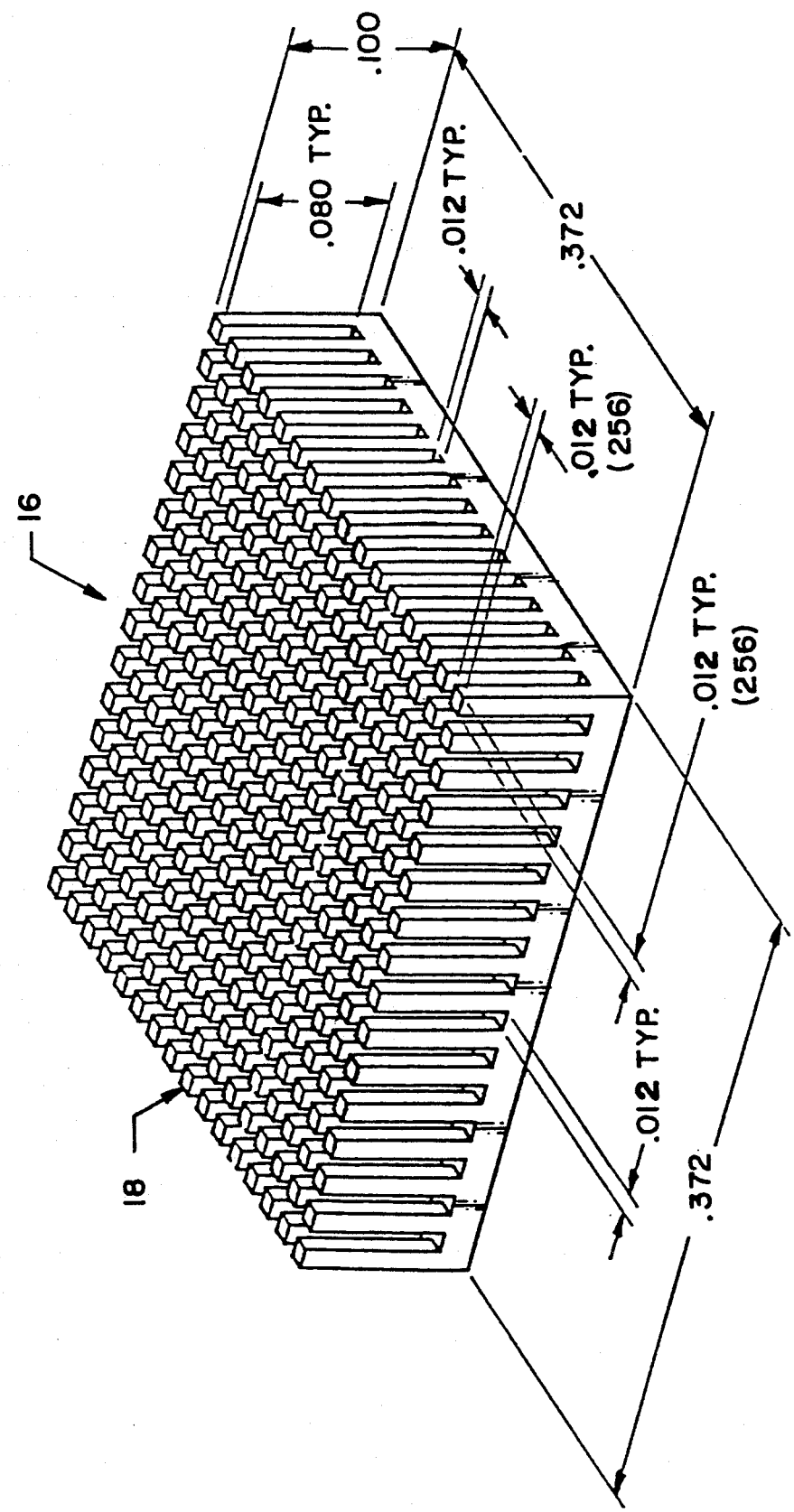
FIG. 2 is a top view of a miniature pin-fin heat sink.

FIG. 2 shows the configuration of the miniature pin-fins heat sink 16 used in the preferred embodiment of the present invention. The heat sink 16 measures 0.375"×0.375"×0.100' and has 256 pin-fins 18 measuring 0.012"×0.012"×0.080" and separated by 0.010" channels. (For a given fin size, the surface area per volume is maximum when the channel size is equal to the fin size). Thus, the pinfins 18 are arranged in a 16×16 matrix having a volume 0.0136 cubic inches. Those skilled in the art will recognize that further increases in the fin density produce greater heat transfer coefficients, allowing the flow rate to be reduced while maintaining the required 80° C. die temperature.

The heat sink 16 is usually centered on the ceramic package 14 and mounted to the underside thereof. The heat sink 16 may be glued to the underside of the ceramic package 14 using a crushed diamond thermal epoxy. The thickness of the thermal epoxy preferably does not exceed 0.002".

The combined technique of a high speed air jet impinging directly on a high fin density heat sink can provide a highly efficient heat transfer mechanism. Moreover, the physical space is comparable to high density packaging systems utilizing low-temperature coolant.

Figure 4:
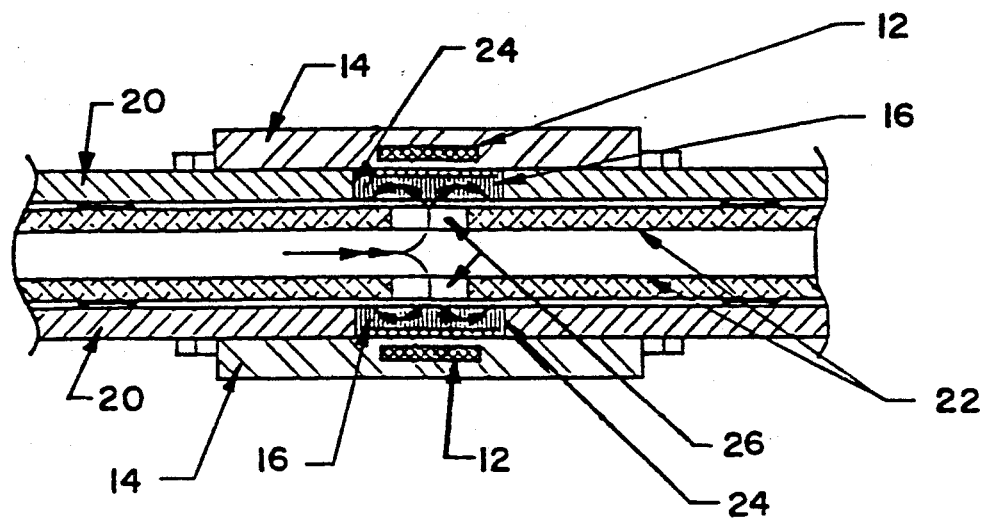
FIG. 4 is a cross-sectional side view of the logic assembly of FIG. 3.
Figure 3:
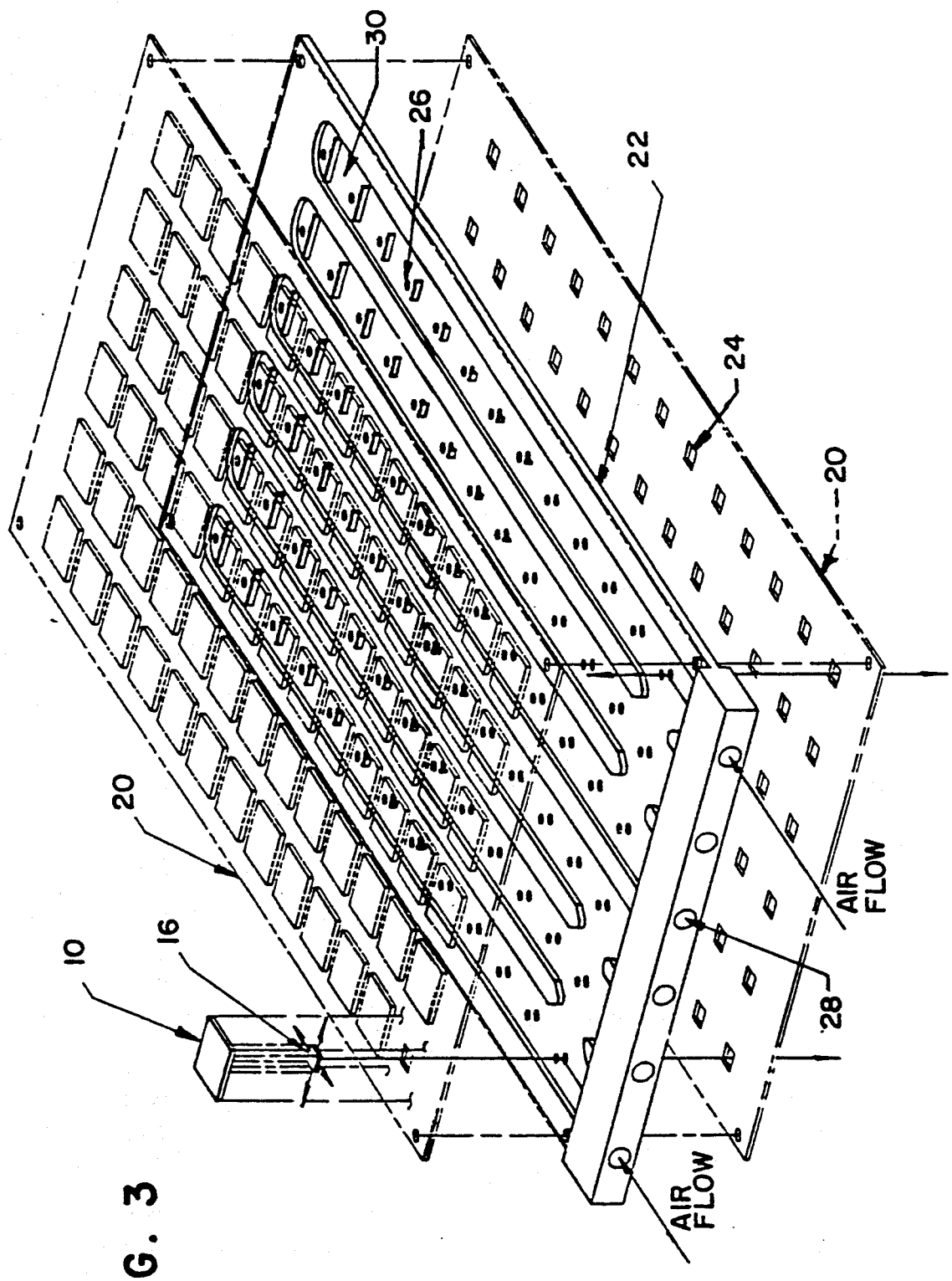
FIG. 3 is an exploded view of a multi-chip module including an air manifold with printed circuit boards mounted thereon.

FIG. 3 describes an air manifold 22, printed circuit board (PCB) 20, and integrated circuit layout for a multichip module in the preferred embodiment of the present invention. FIG. 4 is cross-sectional side view of the module of FIG. 3. The air manifold 22 has six 1.200"×0.125"×20.0" long channels 30 which provide equivalent air flow to 13 air jets above and below the air manifold 22. The air enters each channel 30 at an inlet 28 and exits at 26 0.200" diameter nozzles 26. Pressure boundary conditions are preferably 2.0 p.s.i.g. at the inlets 28 and 0 p.s.i.g. at the nozzles 26, thereby providing the greatest uniformity of air flow.

The PCBs 20 may be attached to each side of the air manifold 22, preferably using spacers or like connectors, thereby providing a gap between the PCB 20 and the air manifold 22 for the exhaust of the air flow. In the preferred embodiment, each PCB 20 may have six rows of 13 integrated circuits 10. Each integrated circuit 10 is mounted over an aperture 24 in the PCB 20 and secured thereto by means of a wave soldering process, or some other means of attachment. The pattern of apertures 24 in the PCB 20 is preferably identical to the pattern of nozzles 26 in the air manifold 22. Attached to the underside of the ceramic package 14 and extending through the aperture 24 is the miniature pin-fin heat sink 16. An air jet with average velocity of 75 ft/sec exits from the nozzle 26 and is directed through the aperture 24, thereby directly impinging upon the miniature pin-fin heat sink 16.

In the preferred embodiment, there is little or no gap between the nozzle 26 and the top of the miniature pin-fin heat sink 16. Such a configuration provides the highest packaging efficiency and thermal transfer characteristics. Preferably, the air jet exiting from the nozzle 26 does not expand prior to impinging upon the miniature pin-fin heat sink 16, where it is broken up into separate fluid paths.

The combination of the air jet impingement cooling method with the miniature pin-fin heat sink 16 dissipates approximately 12.6 watts with the air jet speed is approximately 75 feet/second, to obtain a temperature rise of 63° C. and a corresponding thermal resistance of 5.0° C./watt. In this preferred embodiment, heat flux can exceed 10,000 Btu/hr.ft$^2$ from the miniature pin-fin heat sink 16.

While it is desirable to achieve the highest possible thermal efficiency for cooling electronic devices, it is also advantageous to avoid re-packaging multi-chip modules and assemblies. Thus, in the preferred embodiment, the air manifold is preferably identical in composition, construction, and configuration to the cold plate described in the co-pending and commonly assigned U.S. Pat. No. 5,014,904 issued May 14, 1991 to Dave M. Morton, entitled "BOARDMOUNTED THERMAL PATH CONNECTOR AND COLD PLATE", which application is hereby incorporated by reference. By maintaining a similar configuration, the air manifold 22 may be used in place of the Morton cold plate.

Although a preferred embodiment has been illustrated and described for the present invention, it will be appreciated by those of ordinary skill in the art that any apparatus which is calculated to achieve the same purpose may be substituted for the specific configuration shown.

For example, any gas or fluid may be used with the present invention as a substitute for air. Preferably, the cooling gas or fluid used is one that flows easily, has good thermal transfer characteristics, and has minimal electrical conductivity. However, air is preferred, because it does not require expensive and cumbersome pumping and recovery systems, in contrast to what may be required for other cooling gases or fluids.

This application is intended to cover any adaptations or variations of the present invention. Therefore, it is manifestly intended that this invention be limited only by the claims and the equivalents thereof.

What is claimed is:

1. An apparatus for using a cooling air flow to dissipate heat from an electronic device mounted on a printed circuit board, comprising:
   (a) a discrete air manifold mounted adjacent to the printed circuit board;
   (b) inlet means on said manifold for accepting the cooling air flow into said manifold; and
   (c) nozzle means on said air manifold for expelling the cooling air flow from said air manifold as an air jet, said air jet impinging upon a face of the electronic device, thereby cooling the electronic device mounted on the printed circuit board.

2. The apparatus of claim 1, further comprising aperture means through the printed circuit board for directing said air jet onto the electronic device.

3. The apparatus of claim 2, further comprising pin-fin heat sink means attached to the electronic device for maximizing the transfer of heat from the electronic device to said air jet, said pin-fin heat sink means including a base for attachment to the electronic device and a plurality of rows of pins extending therefrom.

4. The apparatus of claim 3, wherein said pin-fin heat ink means extends through said aperture means in the printed circuit board so that no gap exists between said nozzle means and the top of said heat sink means.

5. The apparatus of claim 1, further comprising pin-fin heat sink means attached to the electronic device for maximizing the transfer of heat from the electronic device to said air jet, said pin-fin heat sink means including a base for attachment to the electronic device and a plurality of rows of pins extending therefrom.

6. A method of dissipating heat from an electronic device mounted on a printed circuit board using a cooling air flow, comprising:
   (a) accepting the cooling air flow into a discrete air manifold, said discrete air manifold mounted adjacent to the printed circuit board;
   (b) chambering the cooling air flow in said discrete air manifold;
   (c) expelling the cooling air flow as an air jet through a nozzle on said discrete air manifold; and
   (d) directing said air jet onto a face of the electronic device to localize cooling of the electronic device mounted on the printed circuit board.

7. The method of claim 6, further comprising directing said air jet through an aperture in the printed circuit board onto the electronic device.

8. The method of claim 7, further comprising directing said air jet onto at least one pin-fin heat sink attached to the electronic device, thereby maximizing the transfer of heat from the electronic device to said air jet, said pin-fin heat sink including a base for attachment to the electronic device and a plurality of rows of pins extending therefrom.

9. The method of claim 7, further comprising extending said pin-fin heat sink through said aperture in the printed circuit board so that no gap exists between said nozzle and said heat sink.

10. The method of claim 6, further comprising attaching at least one pin-fin heat sink to the electronic device to maximize the transfer of heat from the electronic device to said heat sink, said heat sink including a base for attachment to the electronic device and a plurality of rows of pins extending therefrom.

11. An apparatus for using a cooling air flow to dissipate heat from electronic devices mounted on a printed circuit board, comprising:
   (a) an air manifold adapted for mounting the printed circuit board adjacent thereto;
   (b) inlet means for accepting the cooling air flow into said manifold;
   (c) nozzle means of said manifold for expelling the cooling air flow from said air manifold as an air jet; and
   (d) pin-fin sink means attached to the electronic devices for maximizing the transfer of heat from the electronic device to said air jet, said pin-fin heat sink means including a base for attachment to the electronic device and a plurality of rows of pins extending therefrom, said air jet impinging upon the ends of said plurality of rows of pins.

12. The apparatus of claim 11, further comprising aperture means through the printed circuit board for directing said air jet onto the electronic device.

13. The apparatus of claim 12, wherein said pin-fin heat sink means extends through said aperture means in the printed circuit board so that no gap exists between said nozzle means and the top of said heat sink means.

14. A method of dissipating heat from electronic devices mounted on a printed circuit board using a cooling air flow, comprising:
   (a) attaching at least one pin-fin heat sink to the electronic device, thereby maximizing the transfer of heat from the electronic device, said pin-fin heat sink including a base for attachment to said electronic device and a plurality of rows of pins extending therefrom;
   (b) accepting the cooling air flow into a manifold, said manifold adapted for mounting printed circuit boards adjacent thereto;
   (c) chambering the cooling air flow in said manifold;
   (d) expelling the cooling air flow as an air jet through a nozzle in said manifold; and
   (e) directing said air jet onto the ends of said plurality of rows and pins of said pin-fin heat sink.

15. The method of claim 14, further comprising directing said air jet through an aperture in the printed circuit board onto the electronic device.

16. The method of claim 15, further comprising extending said pin-fin heat sink through said aperture in the printed circuit board so that no gap exists between said nozzle and said heat sink.

17. An apparatus for using a cooling air flow to dissipate heat from electronic devices mounted on a printed circuit board, comprising:
   (a) an air manifold adapted for mounting said printed circuit board adjacent thereto, said printed circuit board having aperture means therein for directing an air jet onto said electronic device;
   (b) pin-fin heat sink means attached to said electronic devices for maximizing the transfer of heat from said electronic device to said air jet, said pin-fin heat sink means extends through said aperture means of said printed circuit board so that no gap exists between said nozzle means and the top of said heat sink means;
   (c) inlet means for accepting said cooling air flow into said manifold; and
   (d) nozzle means for expelling said cooling said flow from said air manifold as said air jet, said air jet impinging upon and cooling said electronic device.

18. A method of dissipating heat from electronic devices mounted on a printed circuit board using a cooling air flow, comprising:
   (a) accepting said cooling air flow into a manifold, said manifold adapted for mounting said printed circuit board adjacent thereto;
   (b) chambering said cooling air flow in said manifold;
   (c) expelling said cooling air flow as an air jet through a nozzle in said manifold;
   (d) directing said air jet through an aperture in said printed circuit board onto at least one pin-fin heat sink attached to said electronic device to localize cooling of said electronic device, thereby maximizing the transfer of heat from said electronic device to said air jet, said pin-fin heat sink extending through said aperture in said printed circuit board so that no gap exists between said nozzle and said heat sink.

* * * * *

UNITED STATES PATENT AND TRADEMARK OFFICE
CERTIFICATE OF CORRECTION

PATENT NO. : 5,083,194
DATED : January 21, 1992
INVENTOR(S) : Bradley W. Bartilson It is certified that error appears in the above-identified patent and that said Letters Patent is hereby corrected as shown below.

Col. 2, line 25, "0.265''''0,020" ", should read
--x 0.265'' x 0.020''--

In Column 2, line 55, "0.100' ", should read --0.100''--.

In Column 2, line 59, "pinfins" should read --pin-fins--.

In Column 6, line 29, "said" should read --air--.

Signed and Sealed this

Thirteenth Day of July, 1993

Attest:

MICHAEL K. KIRK

*Attesting Officer*  Acting Commissioner of Patents and Trademarks